(12) United States Patent
Yoon

(10) Patent No.: US 6,552,605 B1
(45) Date of Patent: Apr. 22, 2003

(54) DIFFERENTIAL TRANSIMPEDANCE AMPLIFIER FOR OPTICAL COMMUNICATION

(75) Inventor: Taesub Ty Yoon, Los Angeles, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/074,099

(22) Filed: Feb. 11, 2002

(51) Int. Cl.[7] .............................................. H03F 1/02
(52) U.S. Cl. .................. 330/9; 330/85; 330/98; 330/99; 330/260; 330/308; 250/214 A
(58) Field of Search ................ 330/9, 308, 85, 330/98, 99, 260; 250/214 A

(56) References Cited

U.S. PATENT DOCUMENTS

| | | | | |
|---|---|---|---|---|
| 3,845,404 A | * | 10/1974 | Trilling | 330/69 |
| 4,415,803 A | * | 11/1983 | Muoi | 250/214 A |
| 4,415,868 A | * | 11/1983 | Gross | 330/107 |
| 4,724,315 A | * | 2/1988 | Goerne | 250/214 A |
| 5,023,564 A | * | 6/1991 | Jobling | 330/107 |
| 5,392,000 A | * | 2/1995 | Gillig | 330/107 |
| 5,471,665 A | * | 11/1995 | Pace et al. | 330/259 |
| 5,581,212 A | * | 12/1996 | Huang et al. | 330/253 |
| 5,714,909 A | * | 2/1998 | Jackson | 330/308 |
| 5,864,416 A | * | 1/1999 | Williams | 330/278 |
| 6,028,482 A | * | 2/2000 | Herrle | 330/282 |
| 6,084,478 A | * | 7/2000 | Mayampurath | 330/308 |
| 6,208,199 B1 | * | 3/2001 | Andersson | 327/561 |
| 6,218,905 B1 | * | 4/2001 | Sanders et al. | 250/214 A |
| 6,342,694 B1 | * | 1/2002 | Satoh | 250/214 A |

* cited by examiner

Primary Examiner—Michael Tokar
Assistant Examiner—Nguyen Khai
(74) Attorney, Agent, or Firm—Pillsbury Winthrop LLP

(57) ABSTRACT

A differential transimpedance amplifier includes a differential transconductance stage to provide a current to a differential transimpedance stage. The differential transimpedance stage includes two gain stages and provides a voltage. A first feedback element is coupled in parallel with the differential transimpedance stage.

35 Claims, 4 Drawing Sheets

DIFFERENTIAL TRANSIMPEDANCE AMPLIFIER FOR OPTICAL COMMUNICATION

BACKGROUND OF THE INVENTION

1. Field of the Invention

The present invention generally relates to fiber optic communication. More particularly, the present invention relates to a system and method for implementing a transimpedance amplifier ("TIA") that is used in processing fiber optic communication data and capable of operating at and beyond 10 Gigabits-per-second ("Gb/s").

2. Discussion of the Related Art

Optical signals are increasingly being used to communicate between electronic processing devices. As a result, low-cost, high-performance fiber optic interface systems are becoming increasingly necessary. One integral component for fiber optic communication systems is a TIA. TIAs are commonly used for providing a voltage signal proportional to a current signal and are normally implemented by providing a feedback resistor across the input and output nodes of an operational amplifier. One use of a TIA is to convert an input current signal, which is indicative of an optical signal from a fiber optic line, into an output voltage signal.

In optical receiver modules, TIAs generally function as low-noise pre-amplifiers, which largely determines the overall performance of the optical module. In the past, because of the wide bandwidth and the high gain necessary for sensitive data links, TIAs have been implemented with bipolar and gallium arsenide ("GaAs") metal-semiconductor field effect transistors ("MESFET"). These implementations result in high speed processing, but they can be costly and lack high-yield manufacturability.

Recently, metal-oxide-semiconductor ("MOS") technology has become popular for the design of TIAs because of its low cost and high-yield manufacturability. However, using a single MOS gain stage fails to provide enough gain for multi-gigabit operation, because MOS transistors have a lower transconductance than bipolar transistors. Hence, successful high-speed MOS implementations have relied on multiple gain stages, while using various degeneration methods to control the stability of the TIA. One prior art design ("Design #1") is an n-channel metal-oxide-semiconductor ("NMOS") TIA, having three common-source NMOS amplifiers with depletion mode loads constituting the open loop voltage amplifier. A local feedback is applied around the second gain stage to degenerate the gain. A similar second prior art design ("Design #2") utilizes three complementary metal-oxide-semiconductor ("CMOS") amplifiers with diode-connected NMOS devices to control gain for the inverting CMOS amplifiers. However, neither Design #1 nor Design #2 is able to achieve an operating speed of 10 Gb/s. Design #1 operates at 1.0 Gb/s and 1.5 Gb/s, and Design #2 operates between 50 Megabits/second ("Mb/s") and 240 Mb/s. Moreover, Design #2 uses multi-gain stages to increase bandwidth, but no degeneration scheme is employed to control phase margin. Furthermore, in Design #2 only a large feedback resistor is used to control stability, resulting in a degraded overall bandwidth performance.

In an optical receiver module, an optical signal emerging from the fiber is converted to an electrical current by a photodiode, which is then amplified by a TIA. Input power incident on the photodiode preceding the TIA can vary greatly. Sometimes the variation can lead to a current input as large as 2 mA. For good noise performance, the TIA should have a transimpedance gain higher than 1 k $\Omega$. However, a large current input can saturate the amplifier, leading to pulse-width distortion and bit errors. To alleviate this problem, numerous gain control techniques have been employed. In a third prior art design ("Design #3"), U.S. Pat. No. 5,532,471, transimpedance feedback gain is lowered as a function of input drive. In Design #3, two circuit elements (one p-channel metal-oxide-semiconductor ("PMOS") and one NMOS) are used to control the open loop gain, while a third element (NMOS) controls the transimpedance gain. Therefore, three elements are utilized to operate an automatic gain control ("AGC") scheme, leading to a more complicated structure. Moreover, the use of both NMOS and PMOS to control the open loop gain can lead to additional process variations, because NMOS and PMOS device characteristics do not necessarily track each other.

In the TIA system disclosed in another prior art design ("Design #4"), U.S. Pat. No. 5,602,510, the gain control drive that lowers the transimpedance gain is generated directly from the output of the TIA itself, which may lead to an ambiguous and process-dependent threshold for the activation of the gain control mechanism. This configuration may cause degraded sensitivity if gain control is turned on prematurely. Therefore, there is a need for a system and method that provide a more robust transimpedance gain control mechanism with a process independent threshold.

The use of clamping diodes as a gain control technique is employed in a fifth prior art MESFET design ("Design #5"), U.S. Pat. No. 5,646,573. However, such designs are not very amenable to a CMOS implementation, due to the lack of highspeed diodes in CMOS technology. Therefore, there is a need to provide a system and method for implementing a TIA that accommodates better than 2 mA of current and is capable of operating at 10 Gb/s and beyond.

DETAILED DESCRIPTION

Reference in the specification to "one embodiment", "an embodiment", or "another embodiment" of the present invention means that a particular feature, structure or characteristic described in connection with the embodiment is included in at least one embodiment of the present invention. Thus, the appearances of the phrase "in one embodiment" or "according to an embodiment" appearing in various places throughout the specification are not necessarily all referring to the same embodiment. Likewise, appearances of the phrase "in another embodiment" or "according to another embodiment" appearing in various places throughout the specification are not necessarily referring to different embodiments.

Figure 1:
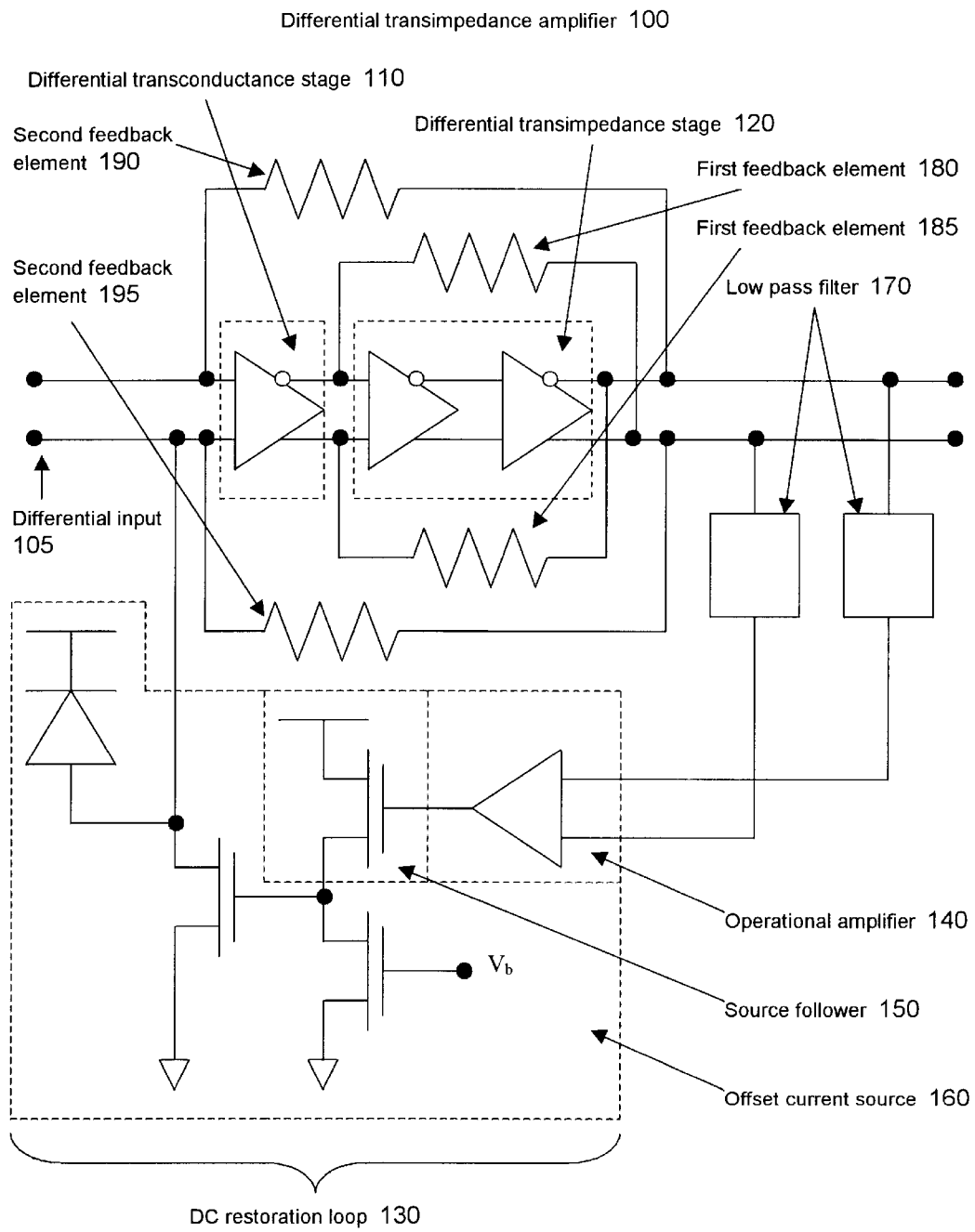
FIG. 1 illustrates a differential transimpedance amplifier according to an embodiment of the present invention.

FIG. 1 illustrates a differential transimpedance amplifier according to an embodiment of the present invention. The differential TIA 100 includes a differential transconductance stage 110, a differential transimpedance stage 120, and a first feedback element 180, 185. The differential transconductance stage 110 provides a current to the differential transimpedance stage 120. The differential transimpedance stage 120 provides a voltage and may include two gain stages. The first feedback element 180, 185 is coupled in parallel with the differential transimpedance stage 120. The differential TIA 100 may further include a DC restoration loop 130. The DC restoration loop 130 may include an operational amplifier 140 and an offset current source 160. The operational amplifier 140 may be coupled between the differential transimpedance stage 120 and the offset current source 160. The offset current source 160 may be coupled to an input of the differential TIA 100 to reduce a DC offset.

According to an embodiment of the present invention, the DC restoration loop 130 may further include a source follower 150 coupled between the operational amplifier 140 and the offset current source 160. In an embodiment, a low pass filter 170 may be coupled between an output of the differential TIA 100 and the operational amplifier 140. According to an embodiment, a second feedback element 190, 195 may be coupled to an input of the differential TIA 100 and to an output of the differential TIA 100.

Figure 2:
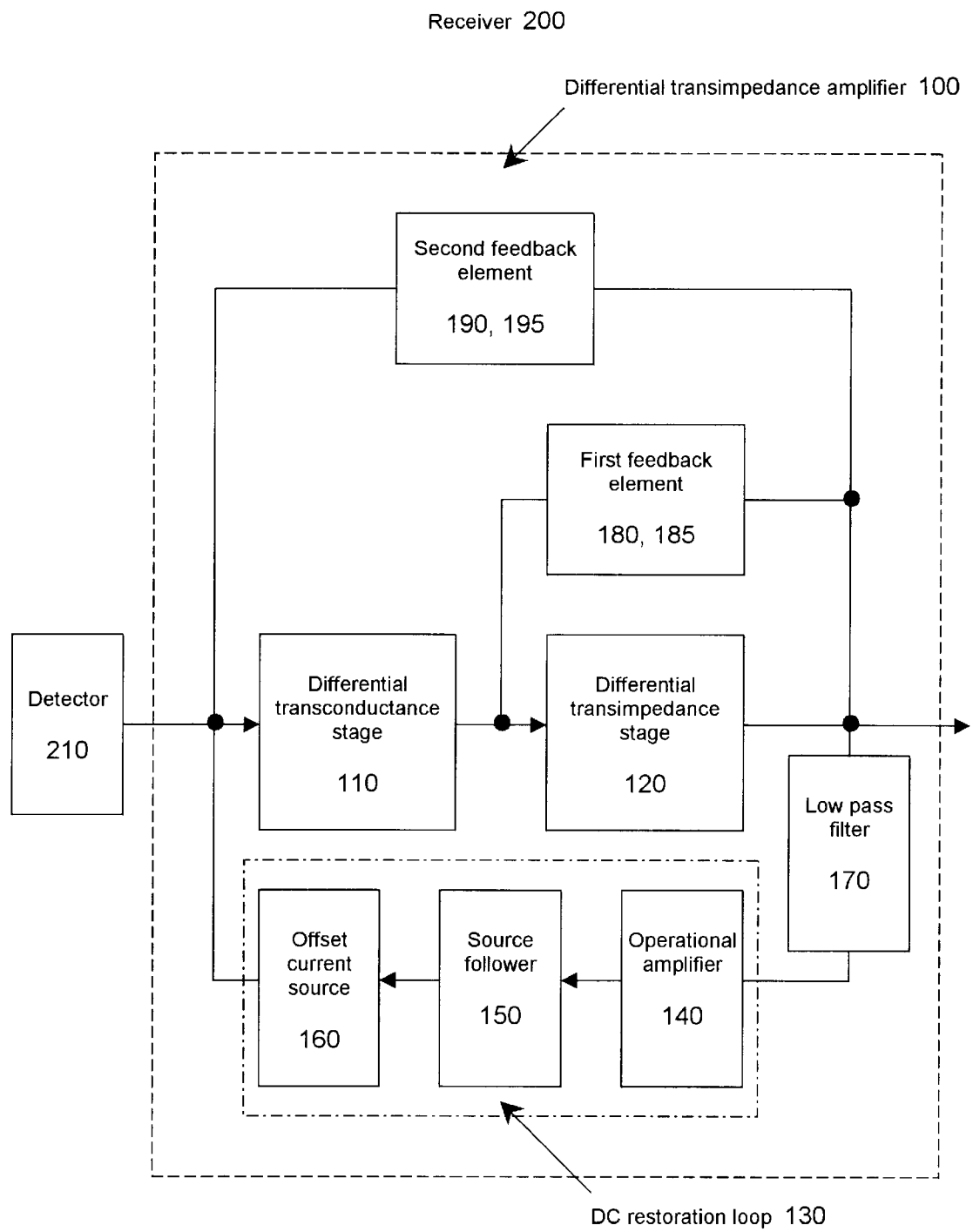
FIG. 2 illustrates a block diagram of a receiver according to an embodiment of the present invention.

FIG. 2 illustrates a block diagram of a receiver according to an embodiment of the present invention. The receiver 200 includes a detector 210 and a differential TIA 100. The detector 210 is coupled to an input of the differential TIA 100. The detector 210 may receive an optical signal and provide an input current to the differential TIA 100. The differential TIA 100 may convert the input current into an output voltage.

Figure 3:
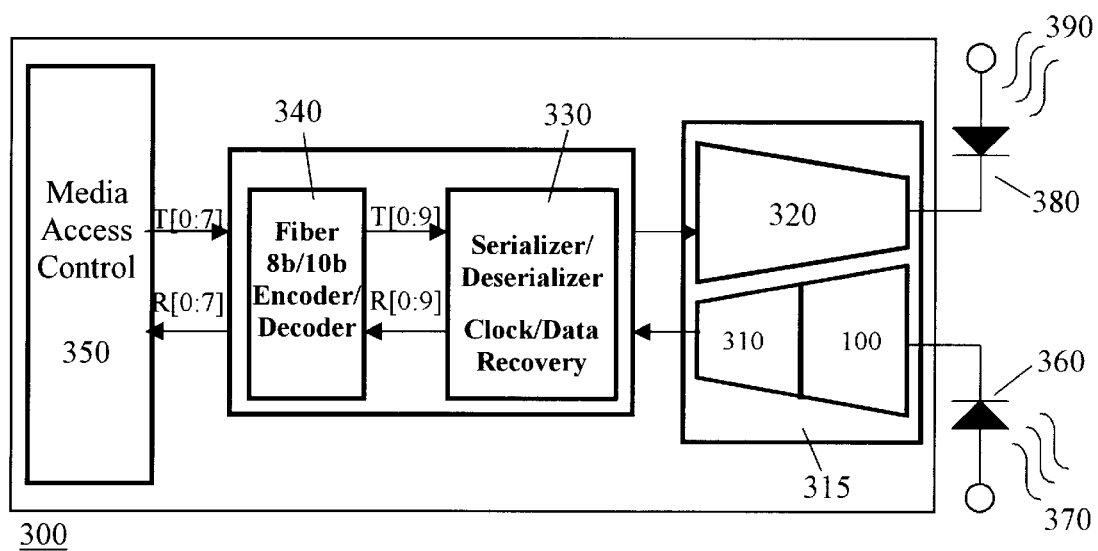
FIG. 3 illustrates a block diagram of a network interface according to an embodiment of the present invention.

FIG. 3 illustrates a block diagram of a network interface according to an embodiment of the present invention. In the embodiment, the network interface may be a Peripheral Component Interconnect ("PCI") interface 300 that serves as an interface between an optical fiber line and a computer system. The PCI interface 300 is often embodied in a network interface card. The PCI interface 300 may comprise an optical receiver/transmitter module 315, a recovery module 330, an encoding/decoding module 340 and a media access control ("MAC") module 350. The optical receiver/transmitter module 315 may include the differential TIA 100 and a limiting amplifier 310 for the receiving mode and a laser driver 320 for the transmitting mode. In the receiving mode, optical signals 370 travel through the optical fiber line and are incident on a photodetector 360, where optical energy, in the form of photons, is converted into electrical energy. The output from the photo-detector 360 is an electrical current, $I_{in}$, which is proportional to the received optical signals. The differential TIA 100 converts $I_{in}$ into an output voltage, which is fed to the limiting amplifier 310. In one embodiment, the limiting amplifier 310 may amplify the TIA output voltage to a level that can be processed by the recovery module 330, and more particularly, a digital clock and data recovery circuit in the recovery module 330. The recovered data is often sent to the encoding/decoding module 340 to be further decoded into a format that may be analyzed by the MAC module 350. The MAC module 350 may, for example, be implemented by CMOS application specific integrated circuits ("ASICs"), and it allows data to move to specified locations within a system.

In the transmitting mode, the process is reversed. In one implementation, digital data may be provided from the MAC module 350 to the encoding/decoding module 340, where the digital data may be encoded into a format that is optimum for converting it into optical signals. If the digital data were already in proper form, processing it by the encoding/decoding module 340 would not be necessary. Sometimes, the encoded digital data needs to be serialized (or deserialized). In such case, the encoded digital data may be fed to the recovery module 330, and more particularly, a serializer (or deserializer) in the recovery module 330. The output from the recovery module 330 may be fed to the laser driver 320, which may be included in the optical receiver/transmitter module 315. Based on the input electrical energy, the laser driver may activate a photo-emitter 380. Optical energy may be created and optical signals 390 may be provided from the PCI interface 300 to the fiber optic line via the photo-emitter 380.

Figure 4:
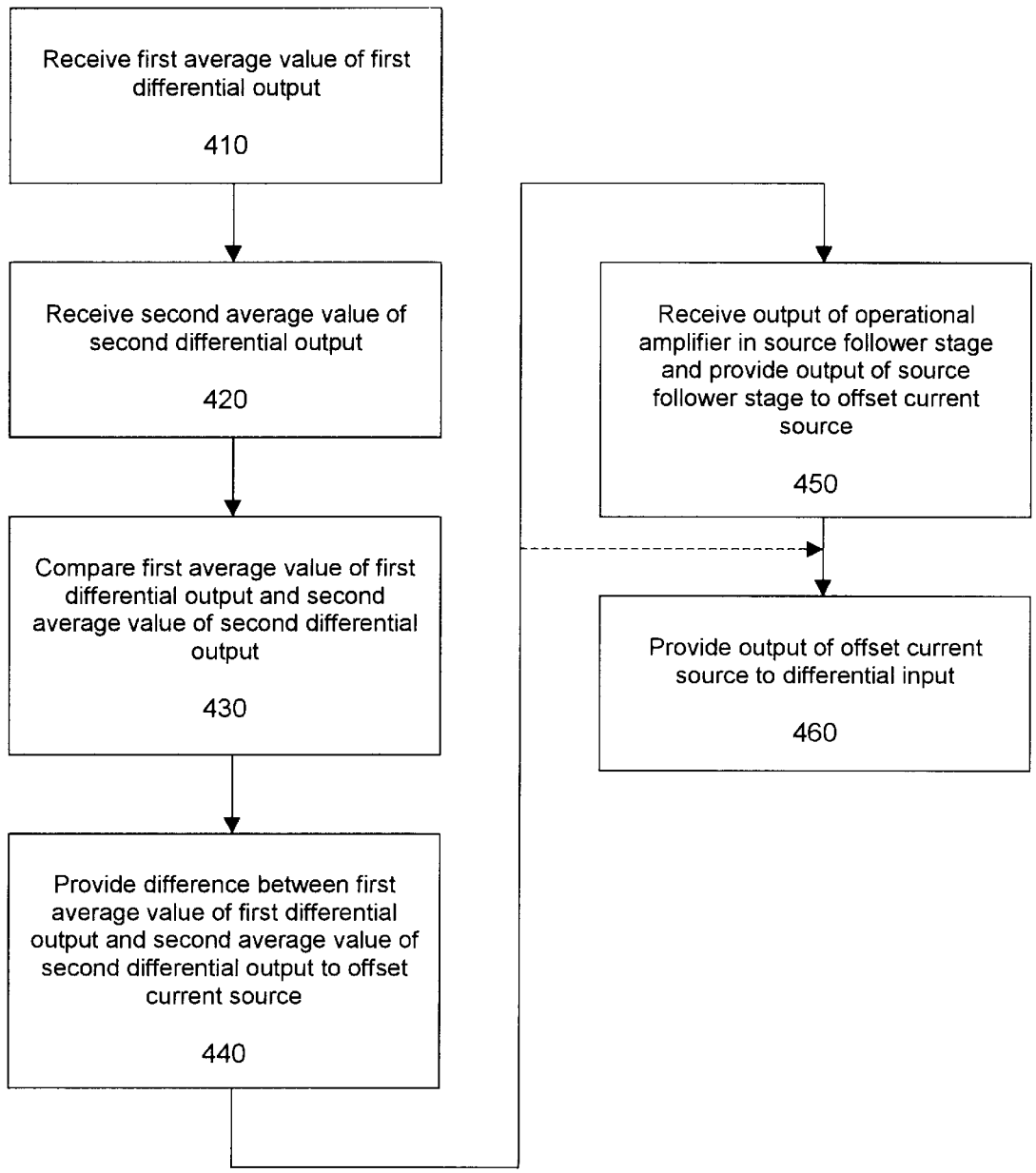
FIG. 4 illustrates a flow chart for a method of reducing a DC offset caused by an input signal current according to an embodiment of the present invention.

FIG. 4 illustrates a flow chart for a method of reducing a DC offset caused by an input signal current. Within the method and referring to FIG. 1, a first average value of a first differential output is received 410. A second average value of a second differential output is also received 420. The first average value of the first differential output is compared 430 with the second average value of the second differential output. The comparing of the first average value of the first differential output and the second average value of the second differential output may be performed by an operational amplifier 140. A difference between the first average value of the first differential output and the second average value of the second differential output is provided 440 to an offset current source 160. An output of the operational amplifier 140 may be received 450 in a source follower 150, and an output of the source follower 150 may be provided 450 to the offset current source 160. An output of the offset current source 160 is provided 460 to a differential input 105.

According to an embodiment of the present invention, the receiving of the first average value of the first differential output may be performed by a DC restoration loop 130. In an embodiment, the receiving of the second average value of the second differential output may be performed by a DC restoration loop 130.

In yet another embodiment of the present invention, a program code storage device includes a machine-readable storage medium with machine-readable program code stored thereon, the machine-readable program code having instructions to receive a first average value of a first differential output. For example, the machine-readable storage medium may be a random access memory ("RAM"), a read-only memory ("ROM"), or any other suitable storage medium. The instructions further include receiving a second average value of a second differential output. The machine-readable program code also includes instructions to compare the first average value of the first differential output and the second average value of the second differential output. The instructions further include providing a difference between the first average value of the first differential output and the second average value of the second differential output to an offset current source 160. The instructions also include providing an output of the offset current source 160 to a differential input 105.

According to an embodiment, the machine-readable program code may further include instructions to receive an output of the operational amplifier 140 in a source follower 150 and to provide an output of the source follower 150 to the offset current source 160. In another embodiment, a DC restoration loop 130 may receive the first average value of the first differential output. According to yet another embodiment, a DC restoration loop 130 may receive the second average value of the second differential output. In still another embodiment, an operational amplifier 140 may compare the first average value of the first differential output and the second average value of the second differential output.

The differential TIA 100 according to the present invention provides higher bandwidth than traditional TIAs. Furthermore, the differential TIA 100 is stable and well-suited for high-speed applications.

The use of differential topology improves the differential TIA's 100 common-mode rejection ratio ("CMRR"), which results in improved power supply noise immunity and reduced susceptibility to in-band resonances caused by parasitic inductances in the power supply, a problem that plagues most single-ended high-speed TIAs. The use of differential topology also makes it possible to accommodate large current inputs without the use of complicated automatic gain control ("AGC") schemes, so long as the intrinsic DC bias levels are not shifted by the input. The source follower 150 may be included to reduce the risk of the intrinsic DC bias levels being of such magnitude that they turn on the offset current source 160, regardless of whether an input is provided. Thus, implementing the source follower 150 into the differential TIA 100 design reduces the risk of a significant output offset that can degrade the common-mode rejection ratio ("CMRR") of the differential TIA 100.

By cascading two gain stages in the differential transimpedance stage 120, the open loop gain of the differential TIA 100 is increased, and the bandwidth may be extended proportionally. With the proper DC restoration loop, the differential TIA 100 essentially functions as a limiting amplifier in the presence of large input currents.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A differential transimpedance amplifier, comprising:
    a differential transimpedance stage to provide a voltage, wherein the differential transimpedance stage has an inverting transimpedance input, a non-inverting transimpedance input, an inverting transimpedance output, and a non-inverting transimpedance output;
    a differential transconductance stage to provide a current to the differential transimpedance stage, wherein the differential transconductance stage has an inverting transconductance output and a non-inverting transconductance output,
    a first feedback element coupled to the non-inverting transimpedance output and the inverting transimpedance input, wherein the first feedback element is further coupled to the inverting transconductance output; and
    a DC restoration loop, including an operational amplifier coupled between the differential transimpedance stage and an offset current source, wherein the offset current source is coupled to an input of the differential transimpedance amplifier to reduce the DC offset.

2. The differential transimpedance amplifier according to claim 1, wherein the differential transimpedance stage includes two gain stages.

3. The differential transimpedance amplifier according to claim 1, wherein a second feedback element is coupled to an input of the differential transimpedance amplifier and to an output of the differential transimpedance amplifier.

4. The differential transimpedance amplifier according to claim 1, wherein the DC restoration loop further includes a source follower coupled between the operational amplifier and the offset current source.

5. The differential transimpedance amplifier according to claim 1, wherein a low pass filter is coupled between an output of the differential transimpedance amplifier and the operational amplifier.

6. A differential transimpedance amplifier, comprising:
    a differential transimpedance stage having two gain stages, an inverting transimpedance input, a non-inverting transimpedance input, an inverting transimpedance output, and a non-inverting transimpedance output;
    a differential transconductance stage to provide a current to the differential transimpedance stage, wherein the differential transconductance stage has an inverting transconductance output and a non-inverting transconductance output;
    a first feedback element coupled to the non-inverting transimpedance output and the inverting transimpedance input, wherein the first feedback element is further coupled to the inverting transconductance output; and
    an additional first feedback element coupled to the inverting transimpedance output, and the non-inverting transimpedance input, wherein the additional first feedback element is further coupled to the non-inverting transconductance output.

7. The differential transimpedance amplifier according to claim 6, wherein a second feedback element is coupled to an input of the differential transimpedance amplifier and to an output of the differential transimpedance amplifier.

8. The differential transimpedance amplifier according to claim 6, further including a DC restoration loop having an operational amplifier coupled between an output of the differential transimpedance stage and an input of the offset current source, wherein the offset current source is coupled to an input of the differential transimpedance amplifier to reduce a DC offset.

9. The differential transimpedance amplifier according to claim 8, wherein the DC restoration loop further includes a source follower coupled between the operational amplifier and the offset current source.

10. The differential transimpedance amplifier according to claim 8, wherein a low pass filter is coupled between an output of the differential transimpedance amplifier and the operational amplifier.

11. A receiver, comprising:
    a differential transimpedance amplifier, having
        a differential transimpedance stage to provide a voltage, wherein the differential transimpedance stage has an inverting transimpedance input, a non-inverting transimpedance input, an inverting transimpedance output, and a non-inverting transimpedance output;
        a differential transconductance state to provide a current to the differential transimpedance state, wherein the differential transconductance stage has an inverting transconductance output and a non-inverting transconductance output,
        a first feedback element coupled to the non-inverting transimpedance output and the inverting transimpedance input, wherein the first feedback element is further coupled to the inverting transconductance output; and a DC restoration loop, including an operation amplifier coupled between the differential transimpedance stage and an offset current source, wherein the offset current source is coupled to an input of the differential transimpedance amplifier to reduce a DC offset, and a detector coupled to an input of the differential transimpedance amplifier to detect a signal and to provide an input to the differential transimpedance amplifier.

12. The receiver according to claim 11, wherein the differential transimpedance stage includes two gain stages.

13. The receiver according to claim 11, further including a second feedback element coupled to an input of the differential transimpedance amplifier and to an output of the differential transimpedance amplifier.

14. The receiver according to claim 11, wherein the DC restoration loop further includes a source follower coupled between the operational amplifier and the offset current source.

15. A receiver, comprising:

a differential transimpedance amplifier, including a differential transimpedance stage having two gain stages, an inverting transimpedance input, a non-inverting transimpedance input, an inverting transimpedance output, and a non-inverting transimpedance output;

a differential transconductance stage to provide a current to the differential transimpedance stage, wherein the differential transconductance stage has an inverting transconductance output and a non-inverting transconductance output;

a first-feedback element coupled to the non-inverting transimpedance output and the inverting transimpedance input, wherein the first feedback element is further coupled to the inverting transconductance output; and an additional first feedback element coupled to the inverting transimpedance output and the non-inverting transimpedance input, wherein the additional first feedback element is further coupled to the non-inverting transconductance output.

16. The receiver according to claim 15, further including a second feedback element coupled to an input of the differential transimpedance amplifier and to an output of the differential transimpedance amplifier.

17. The receiver according to claim 15, wherein the differential transimpedance amplifier further includes a DC restoration loop having an operational amplifier coupled between the differential transimpedance stage and an offset current source, wherein the offset current source is coupled to an input of the differential transimpedance amplifier to reduce a DC offset.

18. The receiver according to claim 17, wherein the DC restoration loop further includes a source follower coupled between the operational amplifier and the offset current source.

19. A network interface, comprising:

an optical receiver module having a transimpedance amplifier system to receive an input from a photo-detector, the transimpedance amplifier system including a differential transconductance stage to provide a current to a differential transimpedance stage, wherein the differential transimpedance stage provides a voltage, a first feedback element coupled in parallel with the differential transimpedance stage, and a DC restoration loop, including an operational amplifier coupled between the differential transimpedance stage and an offset current source, wherein the offset current source is coupled to an input of the differential transimpedance amplifier to reduce a DC offset, and a limiting amplifier to receive an output of the transimpedance amplifier;

a recovery module to process an output of the limiting amplifier; and a media access control ("MAC") module to analyze an output of the recovery module.

20. The network interface according to claim 19, wherein the differential transimpedance stage includes two gain stages.

21. The network interface according to claim 19, wherein a second feedback element is coupled to an input of the differential transimpedance amplifier and to an output of the differential transimpedance amplifier.

22. The network interface according to claim 19, wherein the DC restoration loop further includes a source follower coupled between the operational amplifier and the offset current source.

23. A network interface, comprising:

an optical receiver module having a transimpedance amplifier system to receive an input from a photo-detector, the transimpedance amplifier system including a differential transconductance stage to provide a current to a differential transimpedance stage, wherein the differential transimpedance stage includes two gain stages and provides a voltage and a first feedback element coupled in parallel with the differential transimpedance stage, and a limiting amplifier to receive an output of the transimpedance amplifier;

a recovery module to process an output of the limiting amplifier; and a media access control ("MAC") module to analyze an output of the recovery module.

24. The network interface according to claim 23, wherein a second feedback element is coupled to an input of the differential transimpedance amplifier and to an output of the differential transimpedance amplifier.

25. The network interface according to claim 23, further including a DC restoration loop having an operational amplifier coupled between an output of the differential transimpedance stage and an input of the offset current source, wherein the offset current source is coupled to an input of the differential transimpedance amplifier to reduce a DC offset.

26. The differential transimpedance amplifier according to claim 25, wherein the DC restoration loop further includes a source follower coupled between the operational amplifier and the offset current source.

27. A differential transimpedance amplifier, comprising:

a differential transimpedance stage to provide a voltage, wherein the differential transimpedance stage has an inverting transimpedance input, a non-inverting transimpedance input, an inverting transimpedance output, and a non-inverting transimpedance output;

a differential transconductance stage to provide a current to the differential transimpedance stage, wherein the differential transconductance stage has an inverting transconductance output and a non-inverting transconductance output, a first feedback element coupled to the nverting transimpedance output and the non-inverting transimpedance input, wherein the first feedback element is further coupled to the non-inverting transconductance output; and a DC restoration loop, including an operational amplifier coupled between the differential transimpedance stage and an offset current source, wherein the offset current source is coupled to an input of the differential transimpedance amplifier to reduce the DC offset.

28. The differential transimpedance amplifier according to claim 27, wherein the differential transimpedance stage includes two gain stages.

29. The differential transimpedance amplifier according to claim 27, wherein a second feedback element is coupled to an input of the differential transimpedance amplifier and to an output of the differential transimpedance amplifier.

30. The differential transimpedance amplifier according to claim 27, wherein the DC restoration loop further includes a source follower coupled between the operational amplifier and the offset current source.

31. The differential transimpedance amplifier according to claim 27, wherein a low pass filter is coupled between an output of the differential transimpedance amplifier and an input of the operational amplifier.

32. A receiver, comprising:
  a differential transimpedance amplifier, having
    a differential transimpedance stage to provide a voltage, wherein the differential transimpedance stage has an inverting transimpedance input, a non-inverting transimpedance input, an inverting transimpedance output, and a non-inverting transimpedance output;
    a differential transconductance stage to provide a current to the differential transimpedance stage, wherein the differential transconductance stage has an inverting transconductance output and a non-inverting transconductance output,
    a first feedback element coupled to the inverting transimpedance output and the non-inverting transimpedance input, wherein the first feedback element is further coupled to the non-inverting transconductance output; and
    a DC, restoration loop, including an operation amplifier coupled between the differential transimpedance stage and an offset current source, wherein the offset current source is coupled to an input of the differential transimpedance amplifier to reduce a DC offset, and
  a detector coupled to an input of the differential transimpedance amplifier to detect a signal and to provide an input to the differential transimpedance amplifier.

33. The receiver according to claim 32, wherein the differential transimpedance stage includes two gain stages.

34. The receiver according to claim 32, further including a second feedback element coupled to the input of the differential transimpedance amplifier and to an output of the differential transimpedance amplifier.

35. The receiver according to claim 32, wherein the DC restoration loop further includes a source follower coupled between the operational amplifier and the offset current source.

* * * * *